United States Patent
Matsumoto et al.

(10) Patent No.: US 9,966,193 B2
(45) Date of Patent: May 8, 2018

(54) ELECTRIC CIRCUIT DEVICE

(71) Applicant: TAIYO YUDEN CO. LTD., Tokyo (JP)

(72) Inventors: Kenji Matsumoto, Tokyo (JP); Yousuke Nakada, Tokyo (JP); Tetsuo Shimura, Tokyo (JP); Kazuya Sato, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days. days.

(21) Appl. No.: 15/270,798

(22) Filed: Sep. 20, 2016

(65) Prior Publication Data

US 2017/0186551 A1   Jun. 29, 2017

(30) Foreign Application Priority Data

Dec. 24, 2015   (JP) .................................. 2015-252507

(51) Int. Cl.
| | |
|---|---|
| H05K 7/02 | (2006.01) |
| H01G 4/38 | (2006.01) |
| H01G 4/30 | (2006.01) |
| H01G 4/12 | (2006.01) |
| H01G 4/228 | (2006.01) |
| H01L 25/07 | (2006.01) |
| H01L 23/495 | (2006.01) |

(52) U.S. Cl.
CPC ................. *H01G 4/38* (2013.01); *H01G 4/12* (2013.01); *H01G 4/228* (2013.01); *H01G 4/30* (2013.01); *H01L 23/49562* (2013.01); *H01L 23/49575* (2013.01); *H01L 25/072* (2013.01); *H05K 7/02* (2013.01)

(58) Field of Classification Search
CPC . H01G 4/12; H01G 4/228; H01G 4/30; H01L 25/072; H01L 23/49562
See application file for complete search history.

(56) References Cited

U.S. PATENT DOCUMENTS 5,763,946 A * 6/1998 Nakadaira ......... H01L 23/49861
257/693
6,054,765 A * 4/2000 Eytcheson .............. H01L 24/49
257/693

(Continued)

FOREIGN PATENT DOCUMENTS

JP   2010-205847 A   9/2010

*Primary Examiner* — Hoa C Nguyen
*Assistant Examiner* — Keith Depew
(74) *Attorney, Agent, or Firm* — Stein IP, LLC

(57) ABSTRACT

An electric circuit device connecting first and second external elements, the electric circuit device including: a first electronic component; a first bus bar electrically connected to the first electronic component; a second bus bar electrically connected to the electronic component and overlapped with the first bus bar in a direction perpendicular to main surfaces of the first and second bus bars; a first external terminal electrically connecting the first bus bar to the first external element; a second external terminal electrically connecting the second bus bar to the second external element; a first region in the first external terminal electrically coupled to the first external element; and a second region in the second external terminal electrically coupled to the second external element, and at least partially overlapped with the first region in the direction.

9 Claims, 9 Drawing Sheets

(56) References Cited

U.S. PATENT DOCUMENTS

| | | | |
|---|---|---|---|
| 6,441,317 B1* | 8/2002 | Tanaka | H01L 25/072 174/255 |
| 7,504,720 B2* | 3/2009 | Nakatsu | H01L 23/3675 257/712 |
| 8,129,836 B2* | 3/2012 | Takano | H01L 23/49575 257/500 |
| 8,154,114 B2* | 4/2012 | Bayerer | H01L 23/3735 257/700 |
| 8,405,206 B1* | 3/2013 | Duetemeyer | H01L 25/072 257/693 |
| 8,416,556 B2* | 4/2013 | Grimm | H01G 4/224 361/301.1 |
| 8,466,541 B2* | 6/2013 | Jones | H01L 23/049 257/678 |
| 8,502,365 B2* | 8/2013 | Onishi | H01L 23/24 257/678 |
| 8,670,223 B2* | 3/2014 | Imamura | H01G 2/04 361/323 |
| 8,837,150 B2* | 9/2014 | Wortberg | H01L 23/3735 165/104.33 |
| 8,912,644 B2* | 12/2014 | Ide | H01L 23/34 257/675 |
| 8,933,553 B2* | 1/2015 | Nishi | H01L 23/52 257/684 |
| 9,147,666 B2* | 9/2015 | Yoshihara | H01L 23/645 |
| 9,351,423 B2* | 5/2016 | Ishino | H01L 23/4334 |
| 9,373,570 B2* | 6/2016 | Kawahara | H01L 24/40 |
| 9,418,975 B1* | 8/2016 | Yoneyama | H01L 25/18 |
| 9,520,656 B2* | 12/2016 | Kakimi | H01R 4/30 |
| 9,648,736 B2* | 5/2017 | Burns | H05K 1/053 |

\* cited by examiner

ELECTRIC CIRCUIT DEVICE

CROSS-REFERENCE TO RELATED APPLICATION

This application is based upon and claims the benefit of priority of the prior Japanese Patent Application No. 2015-252507, filed on Dec. 24, 2015, the entire contents of which are incorporated herein by reference.

FIELD

A certain aspect of the present invention relates to an electric circuit device.

BACKGROUND

There has been known a structure in which a terminal of an electronic component is coupled to a bus bar. Japanese Patent Application Publication Nos. 2005-237118, 2014-11338, and 11-4584 disclose an art that makes the direction of the electrical current flowing through a terminal such as a positive bus bar coupled to a switching element be opposite to the direction of the electrical current flowing through a terminal such as a negative bus bar.

SUMMARY OF THE INVENTION

When the direction of the electrical current flowing through the positive bus bar is made to be opposite to the direction of the electrical current flowing through the negative bus bar, inductance such as parasitic inductance can be reduced. However, the inductance is not sufficiently reduced.

According to an aspect of the present invention, there is provided an electric circuit device connecting first and second external elements including: a first electronic component, a first bus bar electrically connected to the first electronic component, a second bus bar electrically connected to the electronic component and overlapped with the first bus bar in a direction perpendicular to main surfaces of the first and second bus bars, a first external terminal electrically connecting the first bus bar to the first external element, a second external terminal electrically connecting the second bus bar to the second external element, a first region in the first external terminal electrically coupled to the first external element, and a second region in the second external terminal electrically coupled to the second external element. The second region is at least partially overlapped with the first region in the direction.

DETAILED DESCRIPTION

Hereinafter, embodiments of the present invention will be described.

First Embodiment

Figure 1A:
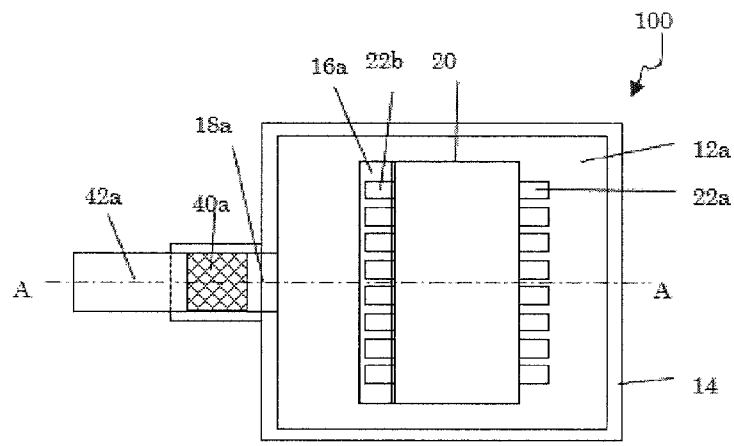
FIG. 1A is a plan view of an electric circuit device in accordance with a first embodiment.
Figure 1B:
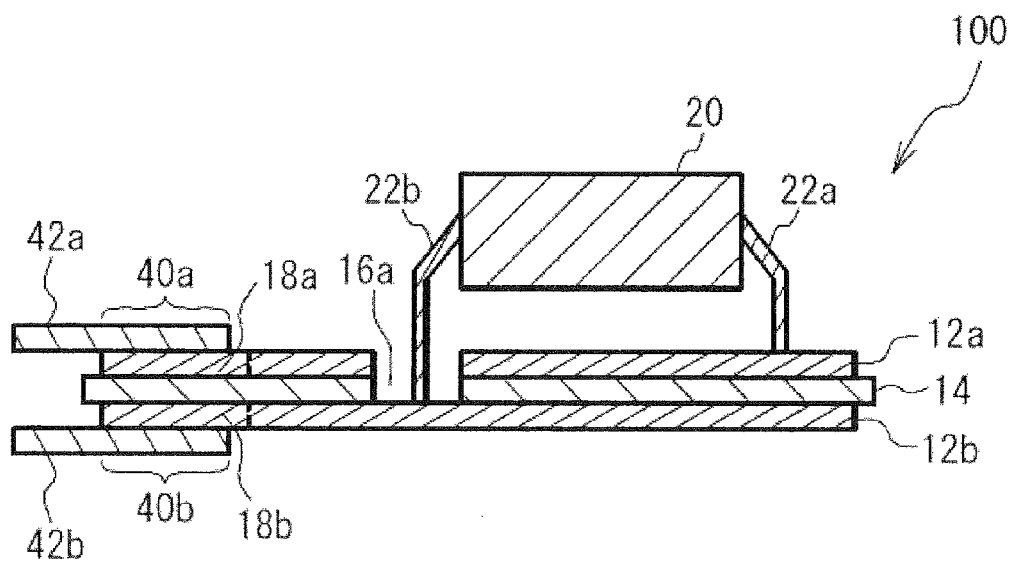
FIG. 1B is a cross-sectional view taken along line A-A in FIG. 1A.

FIG. 1A is a plan view of an electric circuit device in accordance with a first embodiment, and FIG. 1B is a cross-sectional view taken along line A-A in FIG. 1A. FIG. 1B illustrates external conductors in addition to the electric circuit device. As illustrated in FIG. 1A and FIG. 1B, in an electric circuit device 100, bus bars 12a and 12b are stacked so that the bus bars 12a and 12b sandwich an insulating layer 14 and overlap with each other in a plan view. A hole 16a is formed in the bus bar 12a and the insulating layer 14. An electronic component 20 is located above the bus bars 12a and 12b. The electronic component 20 includes a connection terminal 22a and a connection terminal 22b. The connection terminal 22a is coupled to the bus bar 12a. The connection terminal 22b is coupled to the bus bar 12b through the hole 16a. This configuration electrically connects the electronic component 20 to the bus bars 12a and 12b.

External terminals 18a and 18b electrically connect the bus bars 12a and 12b to external elements, respectively. The external terminals 18a and 18b are protrusion portions protruding from the bus bars 12a and 12b, respectively. The insulating layer 14 is located between the external terminals 18a and 18b. The external terminals 18a and 18b overlap with each other in a plan view. The external terminals 18a and 18b are electrically connected to external elements through external conductors 42a and 42b, respectively. The external conductors 42a and 42b are respectively in contact with the external terminals 18a and 18b in regions 40a and 40b indicated by cross-hatching in FIG. 1A. This configuration electrically connects the external conductors 42a and 42b to the external terminals 18a and 18b respectively.

The bus bars 12a and 12b and the external terminals 18a and 18b are made of metal plates such as, for example, copper plates. The bus bar 12a and the external terminal 18a may be made of a metal plate integrally formed. The bus bar 12b and the external terminal 18b may be made of a metal plate integrally formed. The insulating layer 14 is, for example, an insulating resin layer. The electronic component 20 is, for example, a capacitor or a switching element. A plurality of the electronic components 20 may be mounted to the bus bars 12a and 12b. The connection terminals 22a and 22b are metal terminals formed of, for example, copper. The numbers of the connection terminals 22a and 22b may be one or more than one. The external conductors 42a and 42b are formed of metal members such as, for example, copper plates. The external conductors 42a and 42b may be included in the electric circuit device 100, or may not be included in the electric circuit device 100.

Figure 2A:
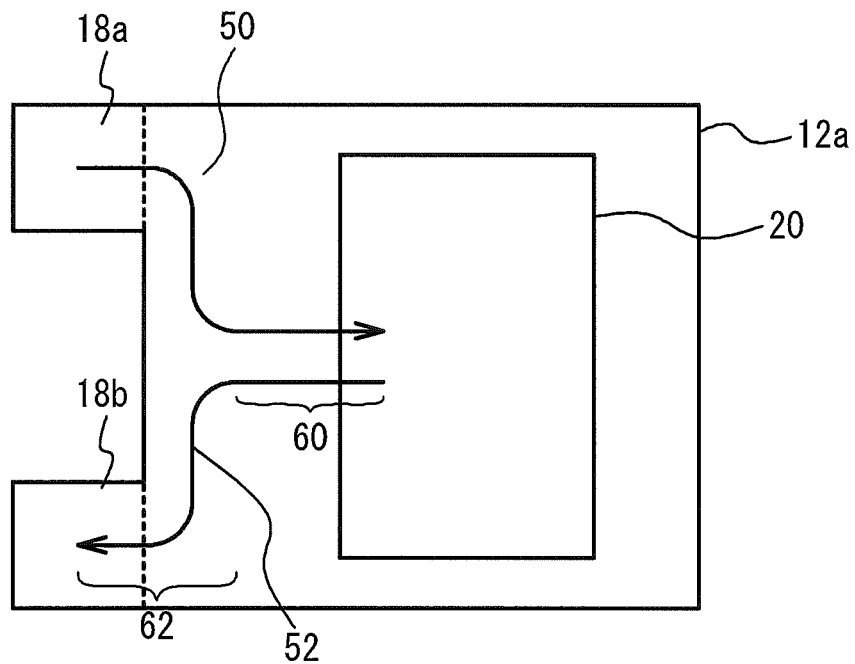
FIG. 2A is a plan view of an electric circuit device in accordance with a first comparative example.
Figure 2B:
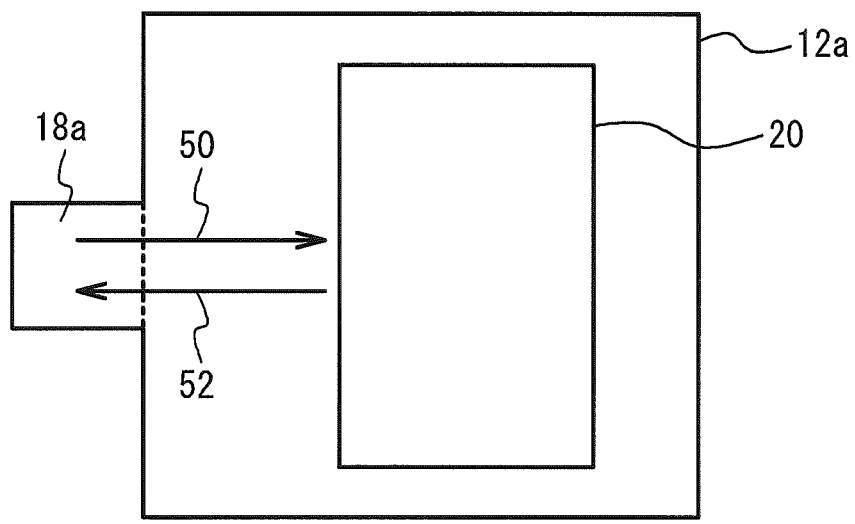
FIG. 2B is a plan view of the electric circuit device of the first embodiment.

FIG. 2A is a plan view of an electric circuit device in accordance with a first comparative example, and FIG. 2B is a plan view of the electric circuit device of the first embodiment. In FIG. 2A and FIG. 2B, a path 50 schematically indicates a current path in the bus bar 12a and the external terminal 18a, and a path 52 schematically indicates a current path in the bus bar 12b and the external terminal 18b. As illustrated in FIG. 2A, the external terminals 18a and 18b do not overlap with each other in a plan view. When a positive voltage is applied to the external terminal 18a and a negative voltage is applied to the external terminal 18b, an electrical current is supplied from the external terminal 18a to the electronic component 20 through the bus bar 12a. The electrical current from the electronic component 20 reaches the external terminal 18b through the bus bar 12b. In a region 60 at the electronic component 20 side in the bus bars 12a and 12b, the paths 50 and 52 overlap with each other and head in opposite directions. Accordingly, the parasitic inductance is reduced.

However, in a region 62 at the external terminals 18a and 18b sides in the bus bars 12a and 12b, the paths 50 and 52 do not overlap with each other nor head in opposite directions. Accordingly, in the region 62, the parasitic inductance cannot be reduced.

As illustrated in FIG. 2B, the external terminals 18a and 18b overlap with each other in a plan view. The paths 50 and 52 in the bus bars 12a and 12b mostly overlap with each other and head in approximately opposite directions. Furthermore, also in the external terminals 18a and 18b, the paths 50 and 52 mostly overlap with each other and head in approximately opposite directions. Accordingly, the first embodiment can reduce the parasitic inductance formed between the external terminals 18a and 18b compared to the first comparative example.

In the first embodiment, as illustrated in FIG. 1A and FIG. 1B, the external terminal 18a (a first external terminal) electrically connects the bus bar 12a (a first bus bar) to an external element. The external terminal 18b (a second external terminal) electrically connects the bus bar 12b (a second bus bar) to an external element. The region 40a (a first region) that is in the external terminal 18a and coupled to an external element and the region 40b (a second region) that is in the external terminal 18b and coupled to an external element at least partially overlap with each other in a plan view. This configuration can reduce the inductance formed between the external terminals 18a and 18b as illustrated in FIG. 2B.

The region 40a is a region that comes into contact with, for example, the external conductor 42a (a first external conductor), and the region 40b is a region that comes into contact with, for example, the external conductor 42b (a second external conductor).

The electronic component 20 electrically connected to the bus bar 12a and the electronic component 20 electrically connected to the bus bar 12b may be the same electronic component or different electronic components.

In FIG. 1B, the insulating layer 14 is located between the external terminals 18a and 18b, and the insulating layer 14 is located between the bus bars 12a and 12b. This configuration can electrically separate the external terminal 18a from the external terminal 18b, and can electrically separate the bus bar 12a from the bus bar 12b.

Second Embodiment

Figure 3:
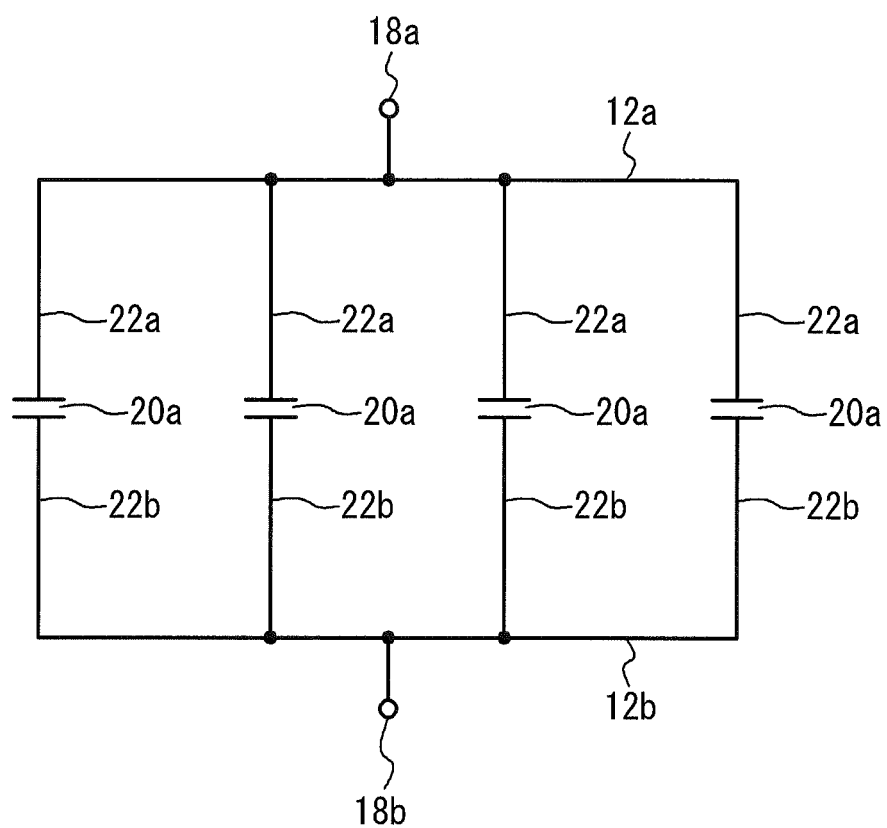
FIG. 3 is a circuit diagram of an electric circuit device in accordance with a second embodiment.

A second embodiment is an exemplary electric circuit device used as a smoothing capacitor connected between power sources. FIG. 3 is a circuit diagram of an electric circuit device in accordance with the second embodiment. As illustrated in FIG. 3, a plurality of capacitors 20a are connected in parallel between the external terminals 18a and 18b. First connection terminals 22a of the capacitors 20a are coupled to the bus bar 12a. Second connection terminals 22b of the capacitors 20a are coupled to the bus bar 12b. The bus bars 12a and 12b are respectively coupled to the external terminals 18a and 18b. A direct voltage is applied between the external terminals 18a and 18b, for example. The external terminals 18a and 18b are, for example, positive and negative terminals, respectively.

Figure 4A:
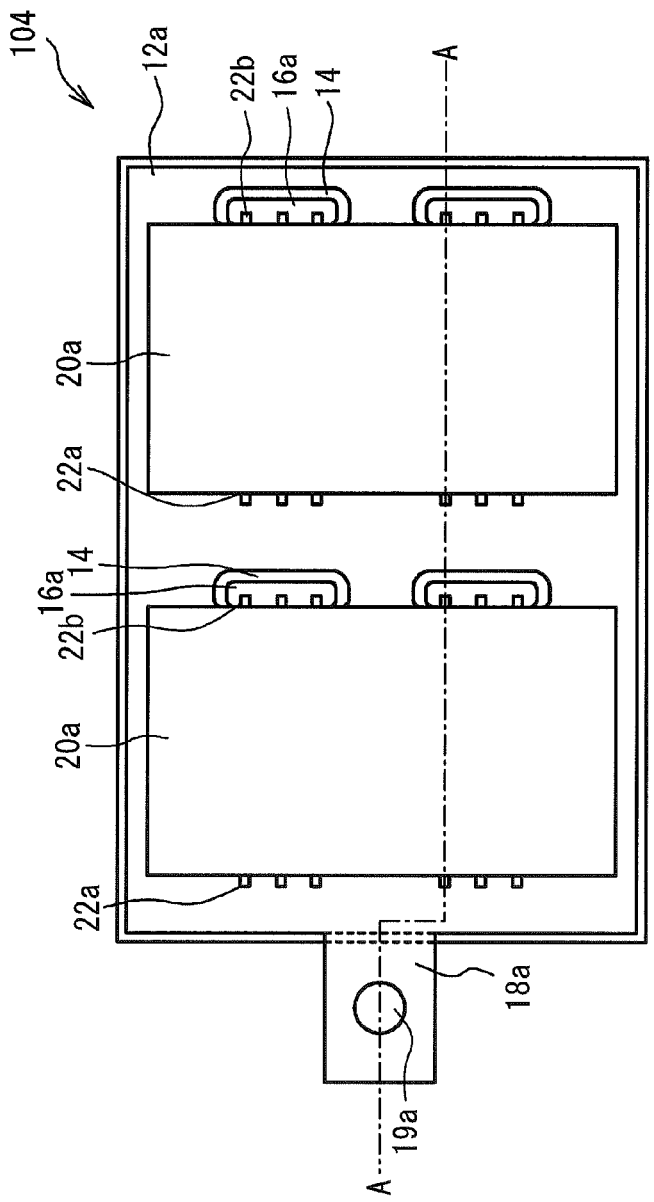
FIG. 4A is a plan view of the electric circuit device of the second embodiment.
Figure 4B:
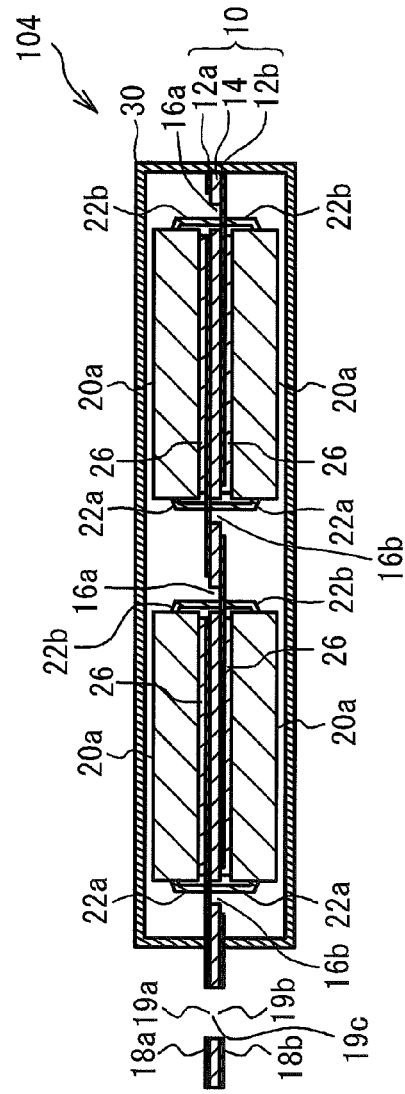
FIG. 4B is a cross-sectional view taken along line A-A in FIG. 4A.

FIG. 4A is a plan view of the electric circuit device in accordance with the second embodiment, and FIG. 4B is a cross-sectional view taken along line A-A in FIG. 4A. FIG. 4A omits the illustration of a chassis at the upper side. As illustrated in FIG. 4A and FIG. 4B, an electric circuit device 104 includes plate-like bus bars 12a and 12b. The bus bar 12a is located on the upper surface of the insulating layer 14, and the bus bar 12b is located on the lower surface of the insulating layer 14. The capacitors 20a are located on the upper surface of the bus bar 12a and the lower surface of the bus bar 12b through adhesive agents 26. Holes 16a penetrating through the bus bar 12a and the insulating layer 14 and holes 16b penetrating through the bus bar 12b and the insulating layer 14 are formed. The connection terminal 22a electrically connects the capacitor 20a and the bus bar 12a, and the connection terminal 22b electrically connects the capacitor 20a and the bus bar 12b. At the upper side of a substrate 10, the connection terminal 22b is coupled to the bus bar 12b through the hole 16a. At the lower side of the substrate 10, the connection terminal 22a is coupled to the bus bar 12a through the hole 16b.

A hole portion 19a is formed in the external terminal 18a, a hole portion 19b is formed in the external terminal 18b, and a hole portion 19c is formed in the insulating layer 14. The hole portions 19a through 19c are formed so that they at least partially overlap with each other. A box-shaped chassis 30 is located so as to surround the bus bars 12a and 12b and the capacitors 20a. The external terminals 18a and 18b are located on a surface of the chassis 30. The external terminals 18a and 18b are electrically connected to the bus bars 12a and 12b, respectively.

Figure 5:
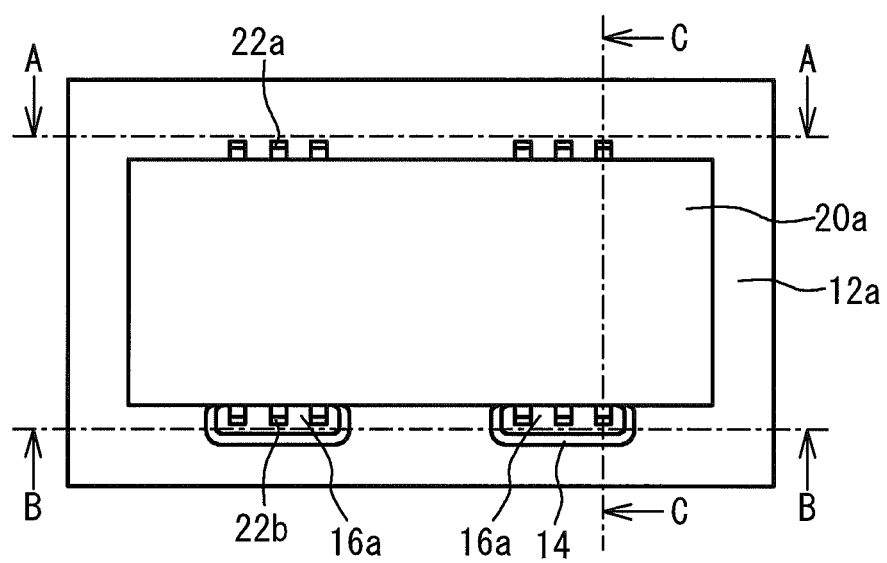
FIG. 5 is a plan view of a capacitor mounted to a bus bar in the second embodiment.
Figure 6A:
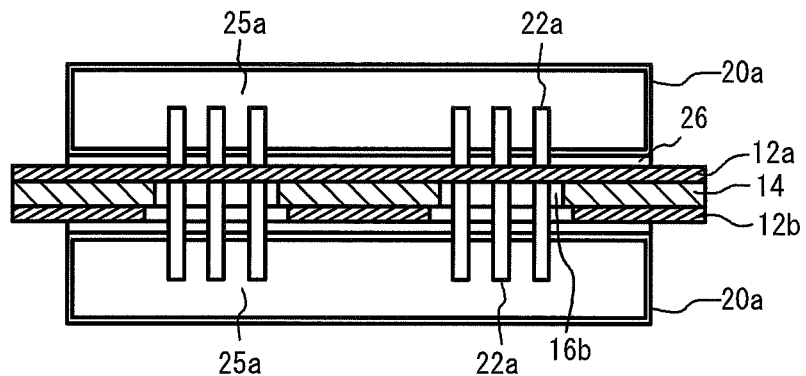
FIG. 6A through FIG. 6C are cross-sectional views taken along lines A-A, B-B, and C-C in FIG. 5, respectively.
Figure 6B:
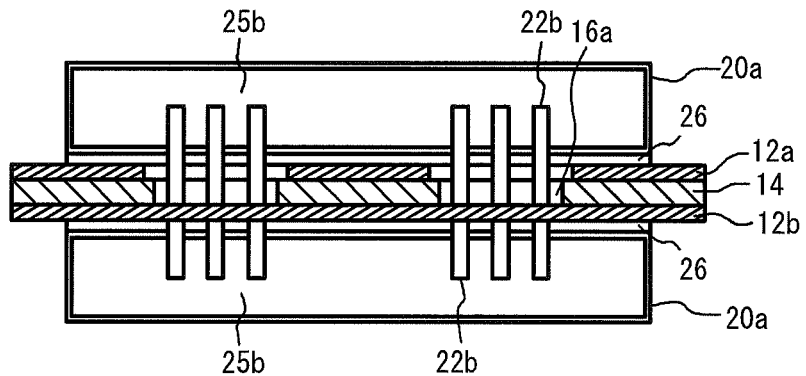
Figure 6C:
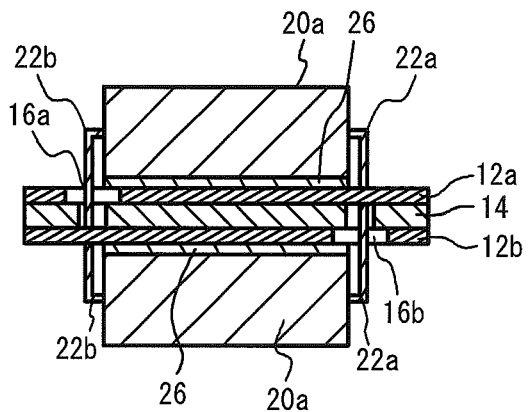

FIG. 5 is a plan view of the capacitor 20a mounted to the bus bar 12a in the second embodiment. FIG. 6A through FIG. 6C are cross-sectional views taken along lines A-A, B-B, and C-C in FIG. 5, respectively. As illustrated in FIG. 5 through FIG. 6C, six connection terminals 22a are coupled to an external electrode 25a formed on a first surface of the capacitor 20a, and six connection terminals 22b are coupled to an external electrode 25b formed on a second surface of the capacitor 20a. Each of the external electrodes 25a and 25b is formed across approximately the entirety of the side surface of the capacitor 20a. The external electrodes 25a and 25b are made of a metal film such as a copper film or a nickel film. The connection terminal 22a of the upper-side capacitor 20a is coupled to the bus bar 12a with the use of solder. The connection terminals 22b of the upper-side capacitor 20a are coupled to the bus bar 12b through the hole 16a with the use of solder in units of three. The connection terminals 22a of the lower-side capacitor 20a are coupled to the bus bar 12a through the hole 16b with the use of solder in units of three. The connection terminals 22b of the lower-side capacitor 20a are coupled to the bus bar 12b with the use of solder. The capacitor 20a is a stacked ceramic capacitor. The stacked ceramic capacitor is a capacitor in which dielectric ceramic sheets sandwiched between internal electrodes are stacked. The internal electrodes are electrically connected to the external electrodes 25a and 25b. The connection terminals 22a may be interconnected by connection wiring lines. The connection terminals 22b may be interconnected by connection wiring lines.

As illustrated in FIG. 3 through FIG. 6C, the external terminal 18a is electrically connected to the connection terminals 22a of the capacitors 20a through the bus bar 12a. The external terminal 18b is electrically connected to the connection terminals 22b of the capacitors 20a through the bus bar 12b. Thus, the capacitors 20a are connected in parallel between the external terminals 18a and 18b. The bus bar 12a mutually connects the connection terminals 22a, and the bus bar 12b mutually connects the connection terminals 22b. The bus bars 12a and 12b reduce the parasitic inductances formed between the external terminals 18a and 18b and the capacitors 20a. Furthermore, one capacitor 20a includes the connection terminals 22a and the connection terminals 22b. This configuration distributes the electrical currents flowing through the bus bars 12a and 12b, and reduces the parasitic inductance. Two or more holes 16a or two or more holes 16b are provided with respect to one capacitor 20a. This configuration secures the paths of the electrical currents flowing through the bus bars 12a and 12b. One hole 16a or one hole 16b may be provided with respect to one capacitor 20a, and the number of the connection terminals 22a or 22b may be increased. This configuration reduces the parasitic inductance between the bus bar 12a or 12b and the capacitor 20a.

Figure 7:
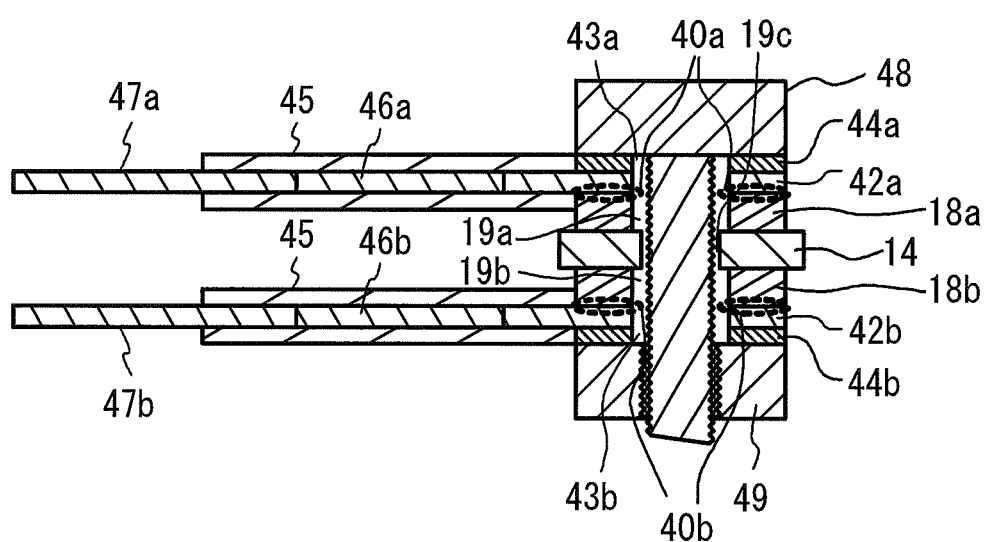
FIG. 7 is a cross-sectional view illustrating an exemplary case where an external terminal is coupled to an external conductor in the second embodiment.

FIG. 7 is a cross-sectional view illustrating an exemplary case where the external terminal is in contact with an external conductor in the second embodiment. The external terminal 18a, the insulating layer 14, and the external terminal 18b are stacked so that the hole portions 19a, 19c, and 19b overlap with each other. Hole portions 43a and 43b are respectively formed in the external conductors 42a and 42b. The external conductor 42a is in contact with the upper surface of the external terminal 18a, thereby being electrically connected to the external terminal 18a. The external conductor 42b is in contact with the lower surface of the external terminal 18b, thereby being electrically connected to the external terminal 18b. The hole portion 43a at least partially overlaps with the hole portion 19a, and the hole portion 43b at least partially overlaps with the hole portion 19b. A washer 44a is located on the external conductor 42a, and a washer 44b is located under the external conductor 42b. A bolt 48 in which spiral screw threads are formed penetrates through the hole portions 43a, 19a, 19b, 19c, and 43b. A nut 49 is screw-engaged with the tip of the bolt 48. Tightening the bolt 48 and the nut 49 makes the external terminal 18a and the external conductor 42a be attached firmly to each other and makes the external terminal 18b and the external conductor 42b be attached firmly to each other. Thus, the contact resistance between the external terminal 18a and the external conductor 42a and the contact resistance between the external terminal 18b and the external conductor 42b are reduced.

The external conductors 42a and 42b are respectively coupled to terminals 47a and 47b through connection conductors 46a and 46b. The connection conductors 46a and 46b are covered with insulating coating films 45. The connection conductors 46a and 46b are, for example, cables. The region 40a in which the external terminal 18a is in contact with the external conductor 42a and the region 40b in which the external terminal 18b is in contact with the external conductor 42b overlap with each other in a plan view. Thus, as in FIG. 2B of the first embodiment, the parasitic inductance between the external terminals 18a and 18b is reduced.

The electric circuit device of the second embodiment is used for, for example, the primary smoothing capacitor of an inverter used for a driving motor of an electric vehicle. The exemplary specification of the electric circuit device is as follows. The operation voltage is 200 V, the rated voltage is 400 V, the electrostatic capacitance is 240 µF, the maximum ripple current is 300 A, and the short-circuit fault current is 1200 A. The operation voltage may be, for example, 48 V or greater and 720 V or less. The electrostatic capacitance may be, for example, 47 µF or greater and 630 µF or less. As described above, the electric circuit device of the second embodiment can be used for the primary smoothing capacitor of a source circuit such as an inverter or a converter.

The insulating layer 14 may be made of an insulating resin with high thermal resistance such as, for example, an epoxy resin or a polyimide resin. The bus bars 12a and 12b may be made of a metal plate such as, for example, a copper plate. The bus bars 12a and 12b and the external terminals 18a and 18b may have film thicknesses of, for example, approximately 0.25 mm or greater. This configuration can reduce the resistances and the inductances of the bus bars 12a and 12b and the external terminals 18a and 18b. The bus bar 12a and the external terminal 18a may be integrally formed into a plate-shape. The bus bar 12b and the external terminal 18b may be integrally formed into a plate-shape. The connection terminals 22a and 22b may be made of a metal plate such as, for example, a copper plate. Each of the connection terminals 22a and 22b may have a resistance of, for example, approximately 1 mΩ. The chassis 30 may be made of an insulating material such as a frame-retardant resin, ceramics, or a metal coated with an insulating substance. An insulating layer with high thermal resistance such as a silicon resin may be located between the chassis 30 and the bus bars 12a and 12b and between the chassis 30 and the external terminals 18a and 18b.

The dielectric strength in the air is approximately 3 kV/mm. This corresponds to 0.21 mm when 630 V is applied between the external terminals 18a and 18b. Temperature, humidity, and atmospheric pressure change the dielectric strength in the air. Considering the margin for the change in dielectric strength, the distance between the external terminals 18a and 18b is preferably made to be 0.5 mm or greater when the air is located between the external terminals 18a and 18b. When the insulating layer 14 is located between the external terminals 18a and 18b and the insulating layer 14 is made of an epoxy resin with high insulation (e.g., FR-4) or a polyimide resin, the distance between the external terminals 18a and 18b can be made to be approximately 0.1 mm. The end surface of the insulating layer 14 is located further out than the end surfaces of the external terminals 18a and 18b by approximately 0.5 mm or greater. This configuration further inhibits breakdown at the end surfaces of the external terminals 18a and 18b. The insulating layer 14 located between the bus bars 12a and 12b may be made of the same material and have the same film thickness as the insulating layer 14 located between the external terminals 18a and 18b.

The bolt 48 and the nut 49 preferably have electrical insulation. The bolt 48 and the nut 49 are preferably made of, for example, a polytetrafluoroethylene resin, a polychlorotrifluoroethylene resin, a polyvinylidene fluoride resin, aluminum oxide, silicon nitride, polycarbonate, a polyether ether ketone resin, a wholly aromatic polyimide resin, rigid polyvinyl chloride, a polyphenylene sulfide resin, RENY (glass fiber 50% reinforced polyamide MXD6), a polyacetal resin, or a glass epoxy resin.

Figure 8:
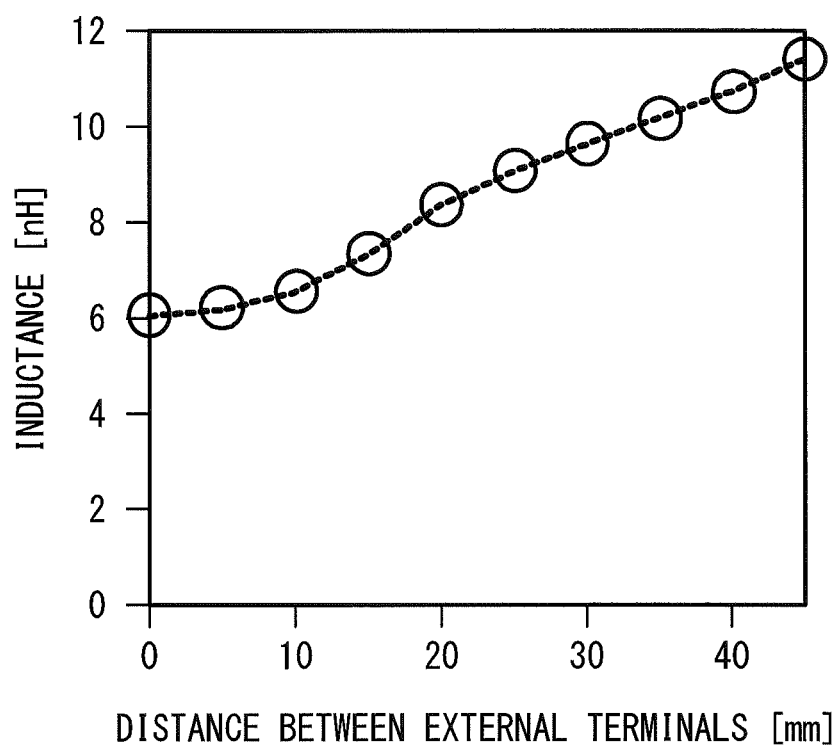
FIG. 8 is a graph of inductance versus distance between external terminals.

The inductance between the external terminals 18a and 18b was simulated by changing the distance between the external terminals 18a and 18b in a plan view. FIG. 8 is a graph of inductance versus the distance between the external terminals. In FIG. 8, the case where the distance is zero corresponds to the second embodiment, and the hole portions 19a and 19b overlap with each other in this case. The external terminals 18a and 18b have dimensions of approximately 15 mm×15 mm in a plan view, and the distance when the external terminals 18a and 18b are the furthest away from each other (the arrangement illustrated in FIG. 2A) is 45 mm. Six capacitors 20a were provided, and the equivalent parallel capacity of each capacitor 20a was 13 nH. As illustrated in FIG. 8, as the distance between the external terminals 18a and 18b increases, the inductance increases. Even when the external terminals 18a and 18b do not completely overlap with each other, the inductance decreases as long as the external terminals 18a and 18b at least partially overlap with each other.

In the second embodiment, the hole portion 19a (a first hole portion) is located in the external terminal 18a, and the hole portion 19b (a second hole portion) is located in the external terminal 18b. The hole portions 19a and 19b at least partially overlap with each other. This configuration allows the bolt 48 to be in the same axis as the hole portions 19a and 19b, for example. The region 40a in which the external terminal 18a is in contact with the external conductor 42a and the region 40b in which the external terminal 18b is in contact with the external conductor 42b can be located so as to overlap with each other in a plan view. Thus, the parasitic inductance can be further reduced. The external terminals 18a and 18b may be located in other than the middle of sides of the bus bars 12a and 12b, respectively.

When the bolt 48 and the nut 49 (contact members) are screw-engaged with each other, the external conductor 42a is made to come into contact with a region in the external terminal 18a, and the external conductor 42b is made to come into contact with a region in the external terminal 18b. Thus, the contact resistances between the external terminal 18a and the external conductor 42a and between the external terminal 18b and the external conductor 42b can be reduced, and the parasitic inductance can be also reduced. The contact members may be a member other than the bolt 48 and the nut 49.

The insulating layer 14 is located between the external terminal 18a and the external terminal 18b. This configuration can electrically insulate the external terminal 18a from the external terminal 18b, and reduce the distance between the external terminal 18a and the external terminal 18b. The insulating layer 14 may be located between the bus bars 12a and 12b.

The bus bar 12a mutually electrically connects the connection terminals 22a (first terminals) of the capacitors 20a. The bus bar 12b mutually electrically connects the connection terminals 22b (second terminals) of the capacitors 20a. As described above, when two or more electronic components are located, the inductances in the bus bars 12a and 12b increase. Thus, the external terminals 18a and 18b are preferably located so as to overlap with each other.

When the capacitor 20a is located so as to overlap with the bus bars 12a and 12b, the inductances between the capacitor 20a and the bus bars 12a and 12b can be reduced. Thus, the effect of the inductance due to the electrical currents flowing through the external terminals 18a and 18b and the bus bars 12a and 12b increases. Therefore, the external terminals 18a and 18b are preferably located so as to overlap with each other.

As illustrated in FIG. 6A through FIG. 6C, the upper-side capacitor 20a (a first electronic component located on the opposite side of the bus bar 12a from the bus bar 12b) and the lower-side capacitor 20a (a second electronic component located on the opposite side of the bus bar 12b from the bus bar 12a) are provided. The positions at which the connection terminals 22a of the upper-side and lower-side capacitors 20a are coupled to the bus bar 12a overlap with each other in a plan view. The positions at which the connection terminals 22b of the upper-side and lower-side capacitors 20a are coupled to the bus bar 12b overlap with each other in a plan view. When the connection terminals 22a and 22b are coupled to the bus bars 12a and 12b, the stress between the bus bar 12a and the bus bar 12b becomes unbalanced. The positions at which the lower and upper connection terminals 22a (or 22b) are coupled to the bus bar 12a (or 12b) are made to overlap with each other. This configuration inhibits the strain caused by stress due to the connection terminals 22a and 22b from being produced in the bus bars 12a and 12b. In addition, even when the temperatures of the bus bars 12a and 12b increase, the strain caused by thermal stress due to the connection terminals 22a and 22b is less likely to be produced in the bus bars 12a and 12b.

Third Embodiment

Figure 9:
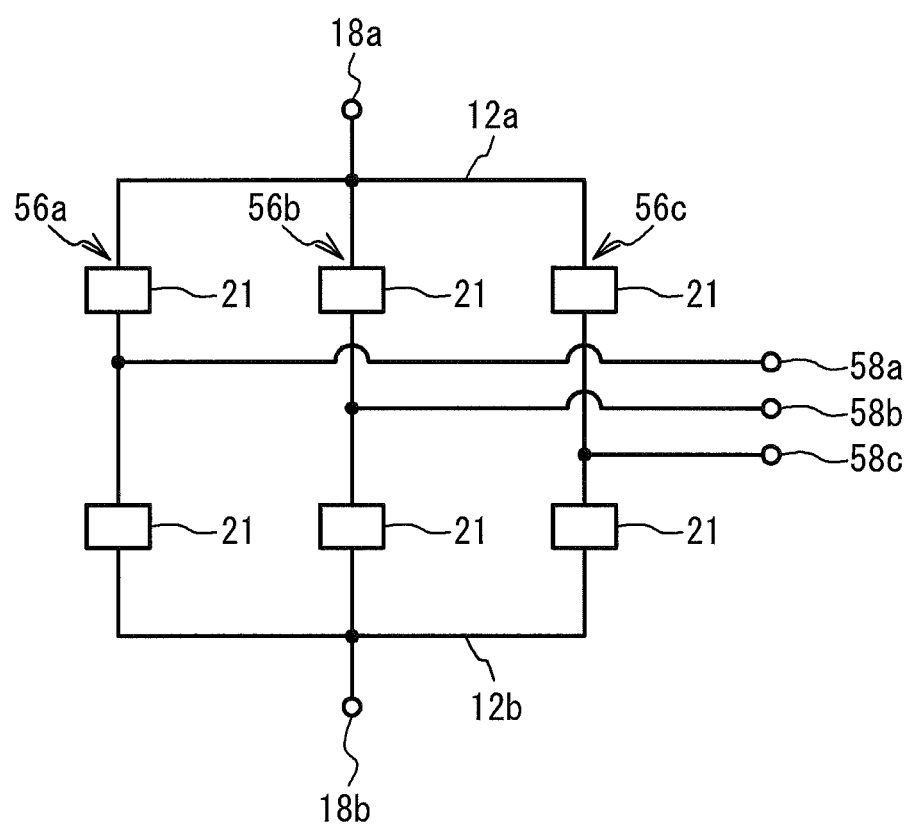
FIG. 9 is a circuit diagram of an electric circuit device in accordance with a third embodiment.

A third embodiment is an exemplary inverter. FIG. 9 is a circuit diagram of an electric circuit device in accordance with the third embodiment. As illustrated in FIG. 9, paths 56a through 56c are located in parallel between the external terminals 18a and 18b. In each of the paths 56a through 56c, two switching elements 21 are connected in series. Terminals 58a through 58c are respectively coupled to nodes between the switching elements 21 in the paths 56a through 56c. First ends of the paths 56 are commonly coupled to the bus bar 12a, and second ends of the paths 56 are commonly coupled to the bus bar 12b. The bus bars 12a and 12b are respectively coupled to the external terminals 18a and 18b. The external terminals 18a and 18b are primary terminals, and the terminals 58a through 58c are secondary terminals.

The switching element 21 is, for example, an Insulated Gate Bipolar Transistor (IGBT), a Metal Oxide Semiconductor Field Effect Transistor (MOSFET), a SiCFET, or a GaNFET. Alternatively, the switching element 21 may be a diode or a thyristor.

Direct-current power is supplied to the external terminals 18a and 18b. When the switching elements 21 are properly controlled, the terminals 58a through 58c output three-phase alternating-current power. As described above, the third embodiment functions as an inverter.

A high-powered motor such as an electric vehicle or an air compressor uses large current, and thus is required to have high heat release performance and low resistance. Thus, a large bus bar is employed. In a source circuit using a switching element, an electrical current can be instantly shut down or allowed to flow by appropriately controlling the switching element. When the switching element shuts down the electrical current, the parasitic inductances of the bus bars 12a and 12b and the external terminals 18a and 18b generate spike surge voltage in the switching element.

The surge voltage exceeding the withstand voltage of the switching element causes the failure of the switching element. Thus, it is important for the electric circuit device used in a source circuit using a switching element to reduce the parasitic inductance. Thus, in the electric circuit device of the third embodiment, the external terminals 18a and 18b are located so as to overlap with each other as in the first and second embodiments. This configuration can reduce the parasitic inductance.

An AC-DC converter or a DC-DC converter may be used as the source circuit using a switching element instead of the inverter.

As described above, the electronic component may be a capacitor as in the second embodiment, or may be a switching element as in the third embodiment. The electronic component may be other electronic components. As in the second embodiment, the connection terminals 22a and 22b of a single electronic component may be coupled to the bus bar 12a and the bus bar 12b. As in the third embodiment, different electronic components may be coupled to the bus bar 12a and the bus bar 12b.

Although the embodiments of the present invention have been described in detail, it is to be understood that the various change, substitutions, and alterations could be made hereto without departing from the spirit and scope of the invention.

What is claimed is:

1. An electric circuit device connecting first and second external elements, the electric circuit device comprising:
   a first electronic component;
   a first bus bar electrically connected to the first electronic component;
   a second bus bar electrically connected to the electronic component and overlapped with the first bus bar in a direction perpendicular to main surfaces of the first and second bus bars;
   a first external terminal electrically connecting the first bus bar to the first external element;
   a second external terminal electrically connecting the second bus bar to the second external element;
   a first region in the first external terminal electrically coupled to the first external element; a second region in the second external terminal electrically coupled to the second external element, and at least partially overlapped with the first region in the direction;
   a first hole formed in the first external terminal;
   a second hole formed in the second external terminal, the first hole and the second hole at least partially overlapping with each other in the direction; and
   contact members penetrating the first hole and the second hole, making the first external conductor contact with the first region, and making the second external conductor contact with the second region.

2. The electric circuit device according to claim 1, further comprising:
   a first external conductor of the first external element contacting the first region; and
   a second external conductor of the second external element contacting the second region.

3. The electric circuit device according to claim 1, further comprising an insulating layer located between the first external terminal and the second external terminal.

4. An electric circuit device according to claim 1, wherein the electronic component is a capacitor.

5. An electric circuit device connecting first and second external elements, the electric circuit device comprising:
   a first electronic component;
   a first bus bar electrically connected to the first electronic component;
   a second bus bar electrically connected to the electronic component and overlapped with the first bus bar in a direction perpendicular to main surfaces of the first and second bus bars;
   a first external terminal electrically connecting the first bus bar to the first external element;
   a second external terminal electrically connecting the second bus bar to the second external element;
   a first region in the first external terminal electrically coupled to the first external element; a second region in the second external terminal electrically coupled to the second external element, and at least partially overlapped with the first region in the direction;
   a first hole formed in the first external terminal;
   a second hole formed in the second external terminal, the first hole and the second hole at least partially overlapping with each other in the direction;
   at least one additional electronic component;
   first terminals connecting a first external electrode of the first electronic component to the first bus bar;
   the other first terminals connecting a first external electrode of the additional electronic component to the first bus bar;
   second terminals connecting a second external electrode of the first electronic component to the second bus bar; and
   other second terminals connecting a second external electrode of the additional electronic component to the second bus bar.

6. The electric circuit device according to claim 5, wherein the first and the additional electronic component overlap with the first bus bar and the second bus bar in the direction.

7. The electric circuit device according to claim 5, wherein:
   the first electronic component is located on a side of the first bus bar, and the additional electronic component is located on a side of the second bus bar.

8. The electric circuit device according to claim 7, further comprising:
   first positions at which the first terminals connect to the first bus bar respectively; and
   second positions at which the other first terminals connect to the first bus bar respectively;
   wherein the first positions overlap with the second positions in the direction.

9. The electric circuit device according to claim 7, further comprising:
   third positions at which the second terminals connect to the second bus bar respectively; and
   fourth positions at which the other second terminals connect to the second bus bar respectively;
   wherein the third positions overlap with the fourth positions in the direction.

* * * * *